United States Patent
Tanaka

(10) Patent No.: US 6,666,964 B2
(45) Date of Patent: Dec. 23, 2003

(54) METHOD OF MANUFACTURING A CIRCUIT BOARD

(75) Inventor: Hisahiro Tanaka, Fukuoka (JP)

(73) Assignee: Matsushita Electric Industrial Co., Ltd. (JP)

( * ) Notice: Subject to any disclaimer, the term of this patent is extended or adjusted under 35 U.S.C. 154(b) by 67 days.

(21) Appl. No.: 10/026,660

(22) Filed: Dec. 27, 2001

(65) Prior Publication Data

US 2002/0112884 A1 Aug. 22, 2002

(30) Foreign Application Priority Data

Dec. 27, 2000 (JP) .......................... 2000-397683

(51) Int. Cl.$^7$ ............................... C25D 5/02
(52) U.S. Cl. ................... 205/125; 205/118; 205/131
(58) Field of Search ................. 205/122, 125, 205/130, 131, 170, 266; 427/96, 97, 98, 261, 282

(56) References Cited

U.S. PATENT DOCUMENTS

| | | | | |
|---|---|---|---|---|
| 3,616,283 A | * | 10/1971 | Magee et al. | 205/122 |
| 4,102,772 A | * | 7/1978 | Nakamura et al. | 204/206 |
| 4,186,062 A | * | 1/1980 | Eidschun | 205/125 |
| 4,230,538 A | * | 10/1980 | Turner | 205/97 |
| 5,176,811 A | * | 1/1993 | Keim et al. | 205/164 |
| 5,546,655 A | * | 8/1996 | Feger et al. | 29/846 |

FOREIGN PATENT DOCUMENTS

JP 2000-183535 6/2000

OTHER PUBLICATIONS

Iwakura, Fumiaki. "Reliability and Evaluation of Wire Bonding Circuit Board." *Surface–Mounting Technology*, vol. 7, No. 5 (1977). pp. 60–63. Partial English translation.

Asakura, Hiroshi. "Structurally Improved CSP Clears Connection Reliability." *Nikkei Microdevices*. Feb., 1998. pp. 48–55. Partial English translation.

Chinda, Akira, et al. "Influence of Nickel Plating Underlayer Deposition Conditions on Bending Characteristics of Palladium Plating Leadframe." *Surface Technology*. vol. 49, No. 12 (1998). pp. 41–48. Partial English translation.

* cited by examiner

*Primary Examiner*—Nam Nguyen
*Assistant Examiner*—Brian L. Mutschler
(74) *Attorney, Agent, or Firm*—Parkhurst & Wendel, L.L.P.

(57) ABSTRACT

A circuit board comprising an insulating substrate, via-holes made in the insulating substrate, and a wiring conductor having at least one layer disposed on the insulating substrate. The circuit board is characterized in that a gold-plated layer of the wiring conductor exposed to the inside of the via-hole is thinner than a gold-plated layer of the wiring conductor exposed to a portion other than the inside of the via-hole in the insulating substrate. A method of manufacturing the circuit board is characterized in that gold electroplating of the wiring conductor is performed with the open-end of the via-hole contacted on a shielding board in a plating bath. The present invention provides a circuit board capable of satisfying the requirements for long-lasting strength of solder ball junction and good wire bonding ability at the same time.

7 Claims, 5 Drawing Sheets

METHOD OF MANUFACTURING A CIRCUIT BOARD

FIELD OF THE INVENTION

The present invention relates to a circuit board such as a high-density printed circuit board, multi-layer printed circuit board and flexible printed circuit board, which is built into electronic equipment such as a semi-conductor package such as IC cards, portable information terminal, a coil circuit board built into a thin-type motor and various magnetic sensors, and a circuit board such as those used for CSP, BGA or the like, and a method of manufacturing the same. Particularly, the present invention relates to a circuit board using an insulating substrate provided with via holes and a wiring conductor comprising a gold-plated layer, and a method of manufacturing same.

BACKGROUND OF THE INVENTION

FIG. 4 is a plan view of a conventional circuit board. Also, FIG. 5A is a partly enlarged plan view of the circuit board, and FIG. 5B is a partly enlarged cross-sectional view of the circuit board. FIG. 5B is a cross-sectional view of FIG. 5A cut by a 5B—5B line.

In FIGS. 5A and 5B, the conventional circuit board 20 comprises an insulating substrate 1, wiring conductor 2, via-hole 3, and solder resist 4.

As shown in FIG. 4, the circuit board 20 has an insulating substrate 1 such as a polyimide film tape on which a specific pattern of wiring conductor 2 is repeatedly formed.

Also, as shown in FIGS. 5A and 5B, the insulating substrate 1 has via-holes 3. Further, a semiconductor chip (not shown), wiring conductor 2 and solder resist 4 to maintain the insulation are laminated on the central portion of the specific pattern of the wiring conductor 2. For the purpose of bonding with the semiconductor chip, a bonding area 5 is formed at the end of the wiring conductor 2.

The surface (top side in FIG. 5B) of the wiring conductor 2 and the back (bottom side in FIG. 5B) of the wiring conductor 2 exposed to the inside of via-hole 3 are plated with nickel (hereafter referred to as "Ni") or gold (hereafter referred to as "Au").

In a semiconductor mounting process, a semiconductor chip placed on solder resist 4 is connected to wiring conductor 2 by a wire bonding method using Au wire or the like, which is followed by resin molding. And, to connect a resin-molded package formed of the semiconductor chip and the circuit board to a board for mounting, a solder ball is heated and poured into via-hole 3 to make connection with conductor 2.

Conventionally, in a case of an electro-plated film circuit board such as BGA, CSP, etc., Au/Ni 2-layer plating is performed in many cases. The top face of wiring conductor 2 including bonding area 5 and the back face of wiring conductor 2 exposed to the inside of via-hole 3 are plated in equal thickness with Ni and Au.

In this case, in Au plating of the top face of wiring conductor 2, it is said that the thermal diffusion of surface Ni due to heating should be reduced and that Au plating should be thicker to obtain proper Au wire bonding (Fumiaki Iwakura): Surface-mounting technology, Vol. 7, No. 5, p. 60 (1997).

On the other hand, regarding the reliability of soldering, it is said that Au plating should be thinner, since brittle intermetallic compound of Au and Sn is formed thick and the solder ball strength decreases through lapse of time when the ratio of Au to Sn in the solder is increased exceeding a specific level (Nikkei Micro-Device, 2, 48, 1998).

And, a method of maintaining proper wire bonding ability by thinning Au layer to about 0.05 μm and removing the Ni diffused on the surface due to heating by plasma ashing in order to maintain the solder ball strength for a long period of time is proposed. Further, a method of 3-layer plating of Au, Pd and Ni have been proposed, but there still exist problems such as increased processing steps and complicated assembling steps.

Also, a method of thickening the Au plating to 0.2 μm in an attempt to satisfy both requirements for maintaining the solder ball strength for a long period of time and for obtaining proper wire bonding ability at the same time (Satoshi Chinda: Surface Technology, 49, 12, 1998) has been proposed. But, there still exists a fear of worsening of one of the above two characteristics irrespective of whether the Au plating is increased or decreased in thickness, and it is difficult to control the Au plating thickness.

The present invention is intended to provide a circuit board capable of satisfying the requirements for maintaining the solder ball strength for a long period of time and obtaining proper wire bonding ability at the same time, and a method of manufacturing same.

SUMMARY OF THE INVENTION

A circuit board of the present invention comprises an insulating substrate, via-holes made in the insulating substrate, and a wiring conductor having at least one layer disposed on the insulating substrate, and is characterized in that the gold-plated layer of the wiring conductor exposed to the inside of the via-hole is thinner than the gold-plated layer of the wiring conductor exposed to a portion other than the inside of the via-hole in the insulating substrate.

Also, a method of manufacturing a circuit board of the present invention comprises an insulating substrate and via-holes formed in the insulating substrate, and a wiring conductor having at least one layer disposed on the insulating substrate, wherein gold electroplating of the wiring conductor is performed with the open-side of the via-hole in the insulating substrate contacted on a shielding board in a plating bath, and a gold-plated layer of the wiring conductor exposed to the inside of the via-hole is formed thinner than a gold-plated layer of the wiring conductor exposed to a portion other than the inside of the via hole in the insulating substrate.

BRIEF DESCRIPTION OF THE INVENTION

FIG. 5 (*b*) is a partly enlarged cross-sectional view of a conventional circuit board.

DETAILED DESCRIPTION OF THE INVENTION

The preferred embodiments of the present invention will be described in the following.

First Preferred Embodiment

Figure 1:
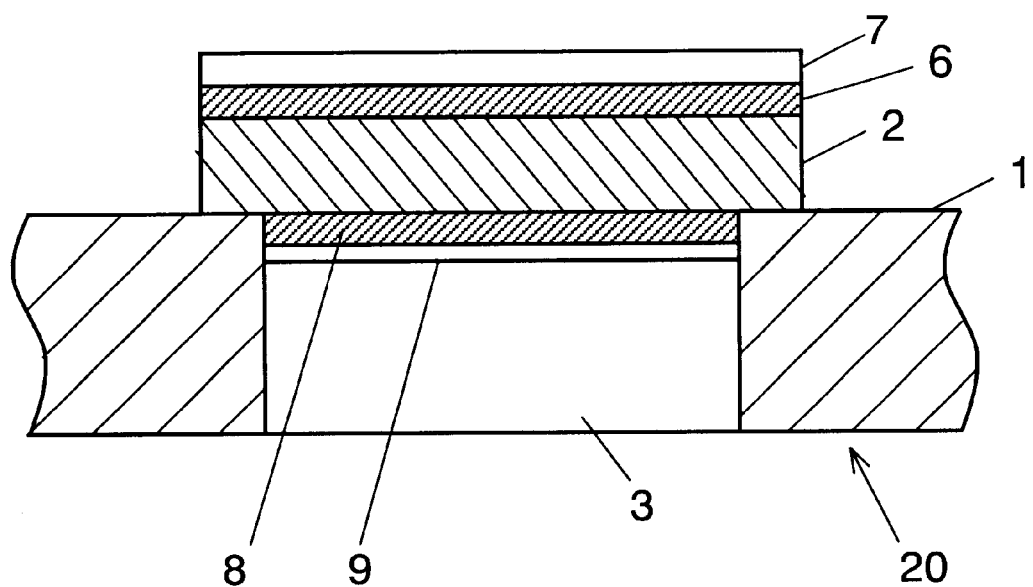
FIG. 1 is an essential portion cross-sectional view of a circuit board in the preferred embodiment 1 of the present invention.
Figure 2:
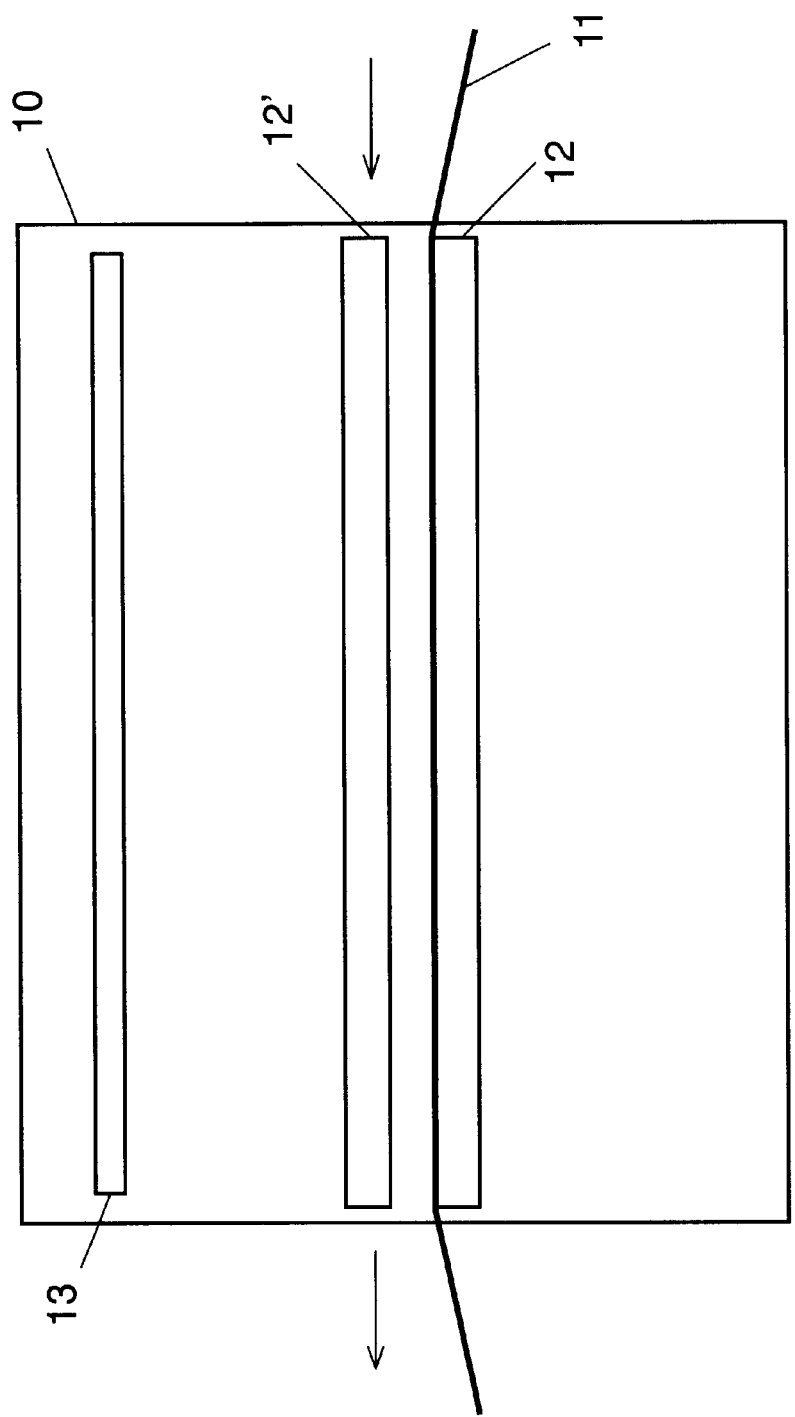
FIG. 2 is a schematic drawing of an Au plating bath of the present invention.

FIG. 1 is an essential portion cross-sectional view of a circuit board in the first preferred embodiment of the present invention. FIG. 2 is a schematic drawing of an Au plating bath used in the prevent invention.

In FIG. 1, the circuit board 20 of the present invention comprises an insulating substrate 1, wiring conductor 2 and via-hole 3. Also, Ni-plated layers 6, 8, and Au-plated layers 7, 9 are respectively formed on either face of the wiring conductor 2.

A plating bath 10 used in the present invention is shown in FIG. 2. Insulating film carrier tape 11 passes between shielding boards 12 and 12'. Reference numeral 13 shows an anode.

Figure 4:
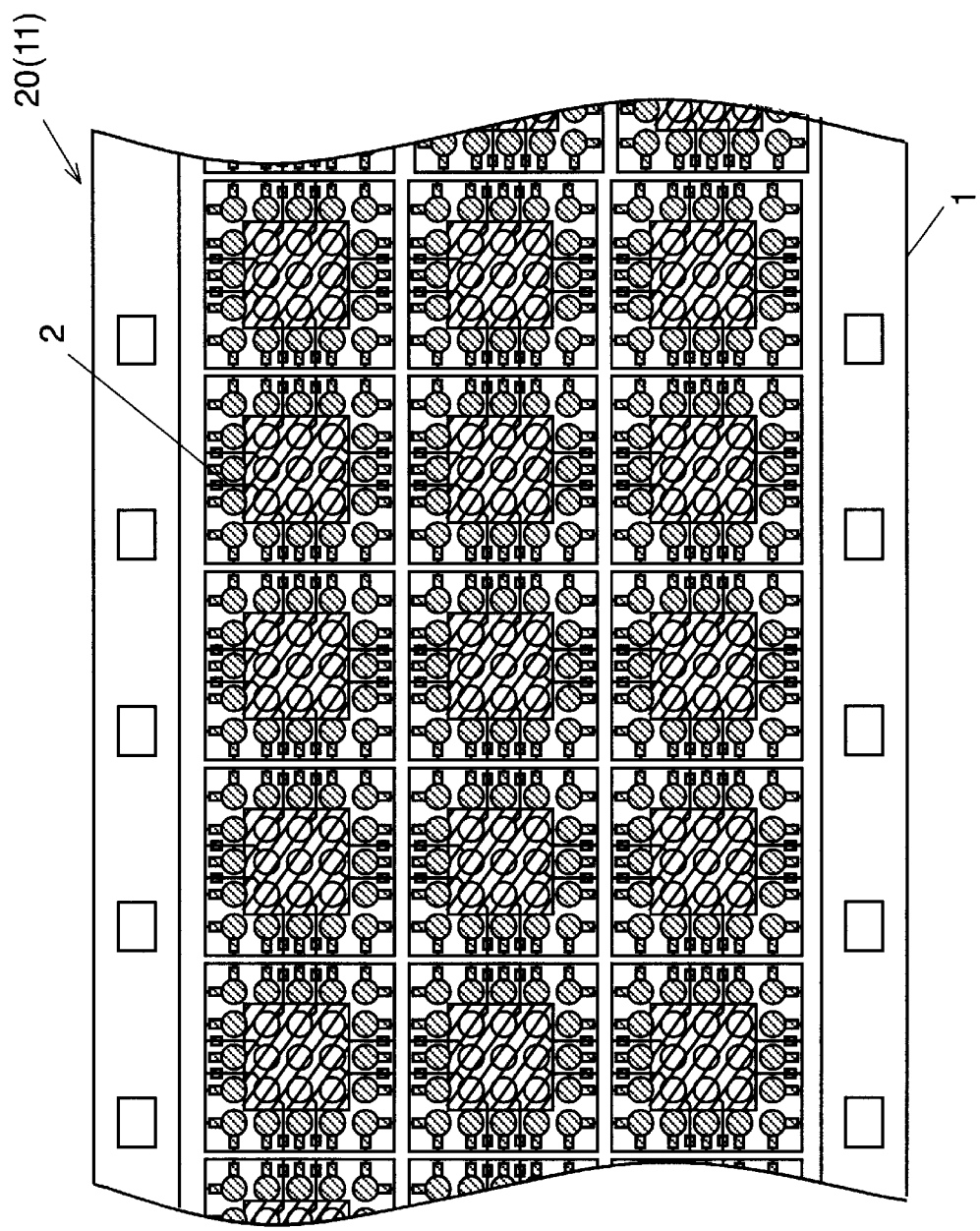
FIG. 4 is a plan view of a conventional circuit board.

As shown in FIG. 1, the circuit board 20 includes the insulating substrate 1 with via-hole 3 formed therein, and the wiring conductor 2 is formed so as to cover one open-end of the via-hole 3. The wiring conductor 2 has a specific pattern as shown in FIG. 4. The surface (top face in FIG. 1) of the wiring conductor 2 and the back (bottom face in FIG. 1) of the wiring conductor 2 exposed to the inside of the via-hole 3 are respectively coated with Ni-plated layers 6, 8, and Au-plated layers 7, 9.

Also, the surface and back of the wiring conductor 2 are individually described here. The entire surface of the wiring conductor 2 is coated with Ni plated layer 6 and further with Au plated layer 7.

The back of the wiring conductor 2 adheres closely to the insulating substrate 1. However, inside the via-hole 3, the back of the wiring conductor 2 is exposed. And, the back of the wiring conductor 2 inside the via-hole 3 is also coated with Ni-plated layer 8 and Au-plated layer 9 in this order.

An important point is that the Au-plated layer 9 formed via Ni-plated layer 8 on the back of the wiring conductor 2 inside the via-hole 3 is thinner than the Au-plated layer 7 formed via Ni-plated layer 6 on the surface of the wiring conductor 2.

Also, the Au-plated layer 7 formed on the surface of the wring conductor 2 is preferably 0.3 $\mu$m or more in thickness, and the Au-plated layer 9 formed on the back of the wiring conductor 2 inside the via-hole 3 is preferably less than 0.3 $\mu$m in thickness, and further preferably less than 0.2 $\mu$m in thickness.

Also, as an example of insulating substrate 1, flexible polyimide film can be used. And, copper foil can be an example of wiring conductor 2. More specifically, as insulating substrate 1, polyimide film with adhesive applied thereto is used and via-hole 3 is formed in the film, and copper foil is laminated thereon. And, a specific pattern is formed on the copper foil to make a circuit board. Also, the material for wiring conductor 2 is not limited to copper foil, but other metallic foil can be used, and other than metallic foil, it is also preferable to employ a conductive material such as conductive resin used as a wiring conductor for a well-known printed circuit board.

Also, besides polymer film like polyimide film, an insulating substrate used for a well-known printed circuit board can be used as a substrate.

It is also preferable to use polyimide film with copper foil using no adhesive layer and to form via-holes in the polyimide film by pattern etching. Available as an etching method for polyimide film is a physical etching method using plasma or excimer laser, and a chemical etching method.

A method of manufacturing a circuit board in the present preferred embodiment will be described in the following.

An adhesive is applied to insulating substrate 1 such as polyimide film, and via-hole 3 is formed therein.

Subsequently, after laminating metallic foil such as copper foil thereon, a specific pattern is formed on the metallic foil by a photo etching method or the like.

Figure 5A:
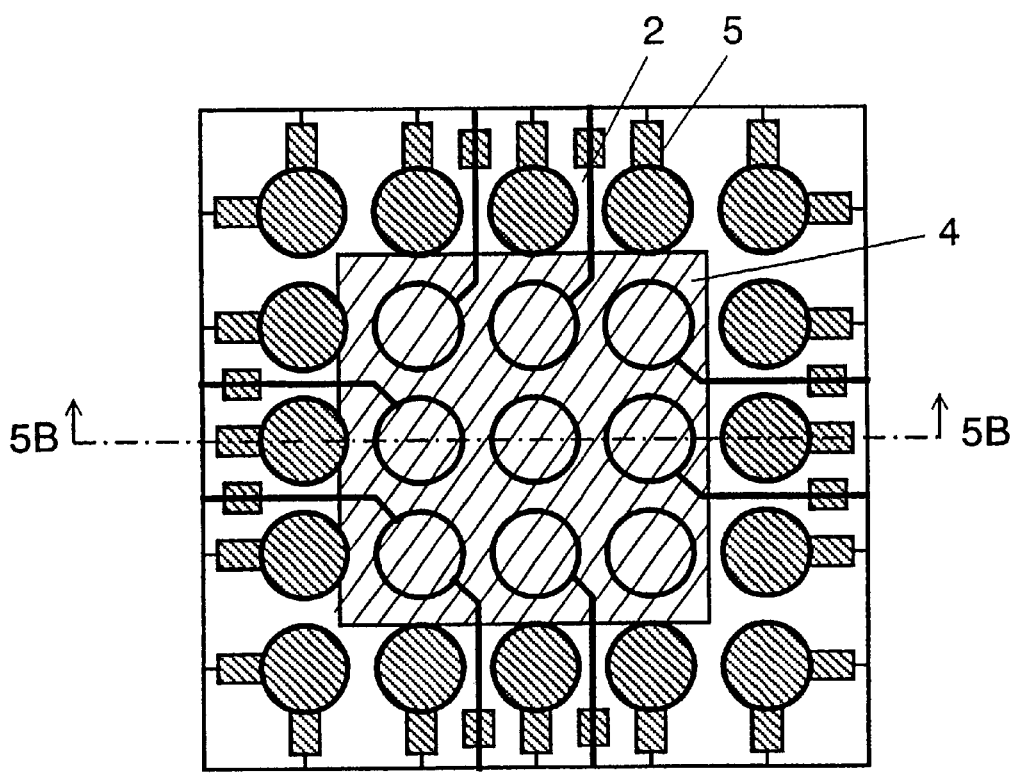
FIG. 5 (*a*) is a partly enlarged plan view of a conventional circuit board.
Figure 5B:
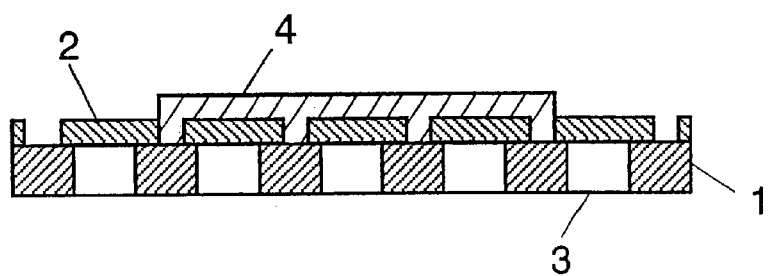

Next, solder resist 4 is formed on the portions where semiconductor chips are mounted and on other necessary portions (see FIGS. 4, 5).

According to the above procedure, carrier tape 11 having wiring pattern-formed conductor 2 and via-hole 3 in the insulating substrate 1 can be obtained.

Next, to form a plated layer on the portion where the wiring conductor 2 of the carrier tape 11 is exposed, pre-treatments such as cleaning and acid activation are performed, followed by electroplating, to form Ni-plated layers 6, 8 on the surface and back face of the wiring conductor 2.

Subsequently, by using a plating bath 10 shown in FIG. 2, electroplating is performed with the open-end of via-hole 3 of the carrier tape 11 contacted on shielding board 12. The open-end of via-hole 3 is a side of the insulating substrate where the wiring conductor 2 is not formed. That is, the via-hole 3 is open at the side without being covered with the wiring conductor 2, which is shown at the bottom portion in FIG. 1.

Also, by electroplating the carrier tape 11 with the open-side of via-hole 3 contacted on the shielding board 12, it is possible to make the Au-plated layer 9 on the back of the wiring conductor 2 inside the via-hole 3 less in thickness than the Au-plated layer 7 on the surface of the wiring conductor 2 at the opposite side. Although the insulating substrate 1 of the carrier tape 11 is contacted on the shielding board 12, the Au plating solution will get into the via-hole 3 via slight clearance between them to form Au-plated layer 9 on the back of the wiring conductor 2 inside the via-hole 3. The quantity of Au plating inside the via-hole 3 is relatively less as compared with the quantity supplied to the surface of the wiring conductor 2. Therefore, it is possible to make the Au-plated layer 9 on the back of the wiring conductor 2 less in thickness than Au-plated layer 7 on the surface of the wiring conductor 2. Thus, an important point in a method of manufacturing a circuit board in the present preferred embodiment is that a difference in thickness between the surface and the back of the wiring conductor 2 can be generated by single electroplating process.

Also, spaced apart from the carrier tape 11 and the shielding board 12 contacted thereon, shielding board 12' is disposed at the opposite position thereof. The shielding board 12' serves to control the electric line of force from anode 13 to the wiring conductor so that the Au plating formed on the wiring conductor 2 becomes uniform in thickness. Although it is not shown, the shielding board 12' may have openings in necessary portions.

And, after the electroplating process, the circuit board 20 is completed after rinsing and drying processes.

Second Preferred Embodiment

Figure 3:
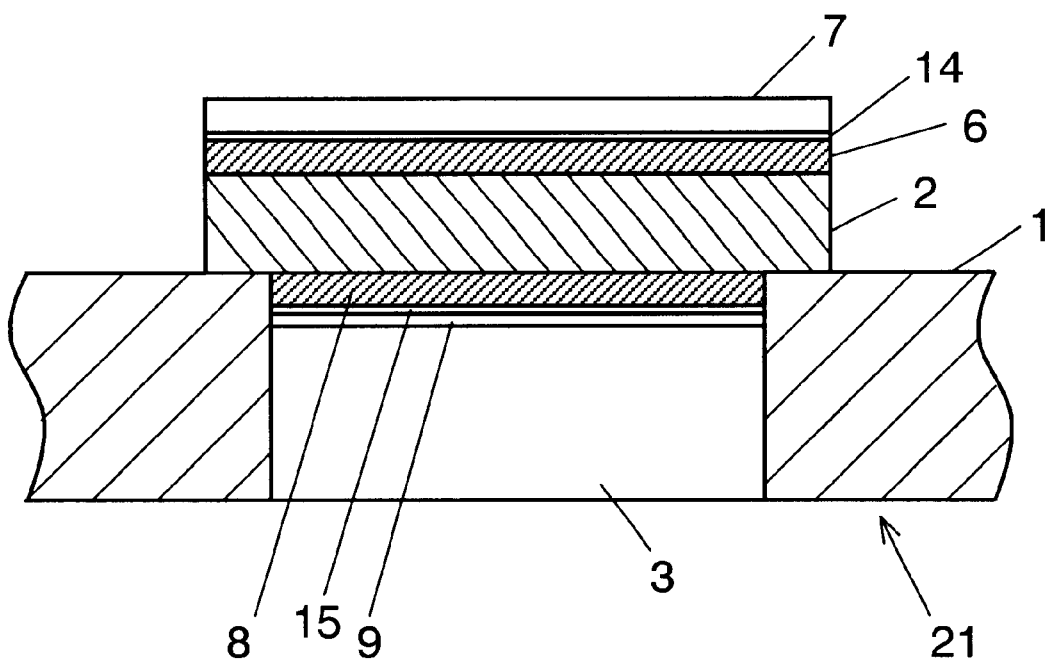
FIG. 3 is an essential portion cross-sectional view of a circuit board in the preferred embodiment 2 of the present invention.

FIG. 3 is an essential portion cross-sectional view of a circuit board in the second preferred embodiment of the present invention.

In the second preferred embodiment of the present invention, as shown in FIG. 3, Au-strike layers 14, 15 are formed on wiring conductor 2 before Au plating. The portions same as those described in FIG. 1 are provided with same reference numerals.

As shown in FIG. 3, circuit board 21 includes insulating substrate 1 with via-hole 3 formed therein, and wiring conductor 2 is formed so as to cover the opening at one end of the via-hole 3. The wiring conductor 2 has a specific pattern as shown in FIG. 4, and the surface (top side in FIG.

3) of the wiring conductor 2 and the portion exposed to the inside of via-hole 3 on the back (bottom side in FIG. 3) of the wiring conductor 2 are respectively coated with Ni-plated layers 6, 8 and Au-strike layers 14, 15, and further Au-plated layers 7, 9.

In the present preferred embodiment, the difference from the first preferred embodiment 1 is that Au-strike layers 14, 15 are formed between Ni-plated layers 6, 8 and Au-plated layers 7, 9.

The function of Au-strike layers 14, 15 will be described in the following. As described in the first preferred embodiment, by contacting the open-end of via-hole 3 with the shielding board 12 in forming Au-plated layer, it is possible to make the Au-plated layer 9 on the back of the wiring conductor 2 thinner than the Au-plated layer 7 on the surface of the wiring conductor 2. However, only contacting the open-side of the via-hole 3 with the shielding board 12 may not be enough to control the plating thickness on the surface and back of the wiring conductor while obtaining sufficient plating thickness because only a specific thickness of Au-plated coating can be obtained by such method.

Accordingly, as preprocessing for Au plating, an Au-strike electroplating process is added to adjust the condition, and thereby, it becomes easier to control the thickness of Au-plated layer. Further, the Au-strike layers 14, 15 also function as surface layers for Au-plated layers 7, 9 to be formed in the next process, improving the adhesion of the Au-plated layers 7, 9 to the Ni-plated layers 6, 8.

Also, installing the Au-strike electroplating bath at the stage preceding the Au plating bath, it is possible to reduce the quantity of Ni plating solution carried into the Au plating bath, thereby preventing the increase of impurities in the Au plating solution.

And, the same as in the first preferred embodiment, the Au-plated layers 7, 9 are respectively formed on the Au-strike layers 14, 15.

Also, in the present preferred embodiment, it is important that the Au-plated layer 9 formed on the back of the wiring conductor 2 inside the via-hole 3 should be thinner than the Au-plated layer 7 formed on the surface of the wiring conductor 2.

Also, the coating thickness of Au-strike layer 14 formed via Ni-plated layer 6 on the surface of the wiring conductor 2 can be arbitrary controlled within a range from 0.01 to 0.2 $\mu$m according to the plating condition. Since the Au-plated layer 7 can be formed within a range from 0.3 to 0.5 $\mu$m, it is possible to control the total thickness of Au-strike layer 14 and Au-plated layer 7 within a range from 0.31 to 0.7 $\mu$m. The total thickness of Au-strike layer 14 and Au-plated layer 7 which are formed on the surface of the wiring conductor 2 is preferable to be 0.3 $\mu$m or more.

Similarly, the coating thickness of Au-strike layer 15 formed on the back of the wiring conductor 2 can be arbitrary controlled within a range from 0.01 to 0.2 $\mu$m according to the plating condition, and the Au-plated layer 9 can be formed within a range from 0.03 to 0.07 $\mu$m. Accordingly, it is possible to arbitrary control the total thickness of Au-strike layer 15 and Au-plated layer 9 within a range from 0.04 to 0.27 $\mu$m. And, the total thickness of Au-strike layer 15 and Au-plated layer 9 which are formed on the back of the wiring conductor 2 is preferable to be less than 0.3 $\mu$m, and further preferable to be less than 0.2 $\mu$m.

A method of manufacturing a circuit board in the present preferred embodiment will be described in the following.

The same as in the first preferred embodiment, Ni-plated layers 6, 8 are formed on the surface and back of the wiring conductor 2.

Next, Au-strike electroplating is performed to form Au-strike layers 14, 15 respectively on Ni-plated layers 6, 8 formed on the surface and back of the wiring conductor 2.

Here, Au-strike electroplating is performed at a high current density for a short time, using a plating bath of low metallic concentration. As described above, the thickness can be easily controlled by controlling the Au-strike electroplating condition. The Au-strike layers 14, 15 also function as a pretreatment layer of Au-plated layers 7, 9 formed in the next process, and also improve the adhesion of Au-plated layers 7, 9 to Ni-plated layers 6, 8.

Also, since the Au-strike electroplating has electrolytic cleaning and surface cleaning effects, it is possible to ensure Au plating with excellent covering power and adhesion.

Next, the same as in the first preferred embodiment, by using a plating bath 10 as shown in FIG. 2, electroplating is performed with the open-end of via-hole 3 of the carrier tape 11 contacted on the shielding board 12. Since the electroplating is performed with the open-end of via-hole 3 of the carrier tape 11 contacted on the shielding board 12, it is possible to make the Au-plated layer 9 on the back of wiring conductor 2 inside the via-hole 3 less in thickness than the Au-plated layer 7 on the surface of the wiring conductor 2. Thus, it is possible to create a difference between the surface and the back of the wiring conductor 2 with respect to the Au plating thickness. After the electroplating, the wiring circuit 21 is completed after rinsing and drying processes.

Exemplary embodiments of the present invention will be specifically described in the following.

EXAMPLE 1

Regarding insulating film tapes used for film circuit boards for semiconductor devices, a plurality of kinds of tapes are generally employed. In the present example, a polyimide tape is used. Firstly, adhesive is applied to the polyimide tape to adhere copper foil thereto. Methods of making via-holes in the polyimide tape are described in the following.

One of the methods is such that a die for perforating the polyimide tape is made first, and by using the die, the tape is punched by means of a press, and thereafter, copper foil is adhered to the tape using adhesive. Another method is such that photoresist is applied to polyimide with no adhesive applied thereto, and after forming a pattern thereon by exposure, it is developed leaving the photoresist as a positive pattern on the insulating film tape, followed by a surface treating of the polyimide with etching solution such as hydrazine and forming Cu foil thereon by Cu spattering process or the like. Further, as described above, it is also possible to make via-holes by etching the polyimide layer of polyimide/copper two-layer laminate which does not use adhesive layer to laminate.

In the present example, a press was employed to perforate the insulating film tape having adhesive, followed by adhering copper foil thereto.

As a method of forming a wiring pattern on the copper foil portion, a method generally employed is such that photoresist is applied to the surface and is exposed a pattern thereon, and thereafter it is developed leaving the photoresist as a positive pattern, followed by processing with etching solution of ferric chloride or cupric chloride. In the present example, a positive resist pattern previously formed by a photolithography on another plate was transferred onto the copper foil surface to obtain etching resist. After that, the copper foil was processed in etching solution of ferric chloride to form a wiring pattern.

Subsequently, an insulating resist layer is formed on the portion on which a semiconductor chip is to be mounted. In the present example, an insulating resist layer of 10 μm thick was formed by a screen printing method.

Next, to form a plated film on the portion where the copper on the tape is exposed, Ni-plating and Au-plating are performed after pre-treatments such as cleaning and acid activation. In the present example, alkaline cleaning solution and 5% hydrochloric acid solution were used in the pre-treatment process.

A Watts nickel bath or a nickel sulfamate plating bath can be used as a Ni-plating bath. In the present example, a chloride-contained nickel sulfamate plating bath with a stress reducer added to adjust the internal stress of the Ni-plated layer was employed to perform 0.5 μm nickel plating.

A Au cyanide bath and Au sulfite bath can be used as an Au plating bath. In the present example, acidic electrolytic pure Au plating solution N-44 (N. E. Chemcat make) was employed. When forming an Au-plated layer, by using a plating bath as shown in FIG. 2, the Au plating was performed with the shielding board contacted on the open-end of the via-hole so as to make the Au plating at the via-hole portion (back of copper foil wiring pattern) less in thickness than the Au plating at the opposite side (surface of copper foil wiring pattern). In that case, if there exists even a slight clearance of a few millimeters or so between the tape to be plated and the shielding board, the Au plating at the via-hole portion will become same in thickness as the Au plating at the opposite side. In this respect, it is also necessary to minimize the warp of the tape. A Pt/Ti insoluble electrode was used as an anode, and the anode was disposed only on the surface side of the wiring conductor in the plating solution. After Au plating, a film circuit board for semiconductor device was completed after pure water rinsing, hot pure water rinsing, and drying processes.

Next, the thickness of Au plating layer thus formed was measured by using a fluorescent X-ray film thickness meter (Fischer instrument XDVM-W), and the thickness of Au and Ni layers were simultaneously measured in 60 sec. by using a 0.05 mm collimator.

EXAMPLE 2

The circuit board has been manufactured in the same process as in the example 1 except that an Au strike plating process for forming a thin Au layer on both sides of the wiring conductor 2 was added between the Ni plating process and the Au plating process. In the present example, acid electrolytic pure Au plating solution N-130 (N. E. Chemcat make) was used as the Au strike plating solution.

Next, the thickness of the Au plating layer formed was measured by the same method as in the example 1.

Comparative Example 1

The circuit board has been prepared in the same way with the example 1 except that 1 mm of clearance was provided between the tape to be plated and the shielding board in the plating bath as in FIG. 2 when forming an Au-plated layer.

Comparative Example 2

The circuit board has been prepared in the same way with the example 1 except that two anodes were disposed 30 mm apart from each other on either side of the tape to be plated when forming an Au-plated layer.

The results are shown in Table 1.

TABLE 1

| | Au plating thickness (μm) | |
|---|---|---|
| | Surface portion | Via-hole portion |
| Example 1 | 0.40 | 0.05 |
| Example 2 | 0.48 | 0.13 |
| Comparative example 1 | 0.40 | 0.40 |
| Comparative example 2 | 0.40 | 0.40 |

As described in the examples, the method of manufacturing a circuit board of the present invention comprises an electroplating process including a step of contacting the open-end of via-hole in the insulating film to the shielding board. Accordingly, it is possible to form the Au-plated layer at the via-hole portion less in thickness than the Au-plated layer at the opposite side as shown in Table 1. Further, since there is provided an Au strike plating process for forming a thin Au layer on both sides of the wiring conductor, it is possible to control the thickness of the Au plating.

On the other hand, in the comparative examples, it is unable to make the thickness of Au plating different between the sides of the wiring conductor, verifying the significance of the advantage of the present invention.

A film circuit board for semiconductor device manufactured by a method as described above is able to satisfy the requirements for long-lasting strength of solder ball junction and proper wire bonding at the same time.

In the exemplary embodiments, an example of Au plating on a single layer film circuit board for semiconductor device was described, but the present invention is not limited to this application.

That is, an example of circuit board with one conductor layer was described for the purpose of simplifying the description in the above exemplary embodiment. However, it is obvious that the present invention is also applicable to general circuit boards for semiconductor devices using multi-layer circuit boards.

That is, in a circuit board for semiconductor device to be mounted on a master board or a like board by using solder ball, a thin gold film is formed on a conductor surface of the mounting surface to which the solder ball is connected, and a thick gold film is formed on a conductor surface other than the mounting surface to which a semiconductor chip or the like is connected. This basic idea of the present invention can be applied to other multi-layer circuit boards for semiconductor devices including IC cards.

As described above, in the present invention, there is provided an electroplating process by contacting the open-side of via-hole in the insulating substrate to the shielding board, and as a result, it is possible to make the Au-plated layer on the back of the wiring conductor inside the via-hole thinner than the Au-plated layer on the surface of the wiring conductor.

Further, since there is provided an Au strike plating process for forming a thin Au layer on both sides of the insulating substrate, it is possible to easily control the thickness of the Au plating.

As a result, the present invention may bring about such advantage that both requirements for long-lasting strength of solder ball junction connected to the conductor at the via-hole and for good wire bonding ability can be simultaneously satisfied. That is, the present invention is able to provide a circuit board capable of satisfying the requirements for long-lasting strength of solder ball junction and proper wire bonding at the same time, and a method of manufacturing the circuit board.

What is claimed is:

1. A method of manufacturing a circuit board comprising:
   providing a circuit board comprising an insulating substrate with at least one via-hole formed therein and at least one layer of wiring conductor formed to cover one end of the via-hole, said via-hole having a via-hole conductor formed therein and said wiring conductor connected to said via-hole conductor;
   simultaneously electroplating a first gold-plated layer on said wiring conductor and a second gold-plated layer on at least a part of said via-hole conductor with the other end of the via-hole in contact with a shielding board in a plating bath, wherein said second gold-plated layer is thinner than said first gold-plated layer.

2. The method of manufacturing a circuit board of claim 1, further comprising gold strike plating preceding said gold electroplating.

3. The method of manufacturing a circuit board of claim 1, wherein said insulating substrate is flexible.

4. The method of manufacturing a circuit board of claim 1, wherein said insulating substrate is a polymer film.

5. The circuit board of claim 1, wherein said circuit board is a multi-layer circuit board.

6. The circuit board of claim 1, wherein said first gold-plated layer is 0.3 $\mu$m or more in thickness, and said second gold-plated layer is less than 0.3 $\mu$m in thickness.

7. The circuit board of claim 1, wherein said via-hole is formed by one of a physical etching method and a chemical etching method.

* * * * *